(12) United States Patent
Toda et al.

(10) Patent No.: US 6,343,239 B1
(45) Date of Patent: Jan. 29, 2002

(54) TRANSPORTATION METHOD FOR SUBSTRATE WAFERS AND TRANSPORTATION APPARATUS

(75) Inventors: Masayuki Toda, Yonezawa; Tadahiro Ohmi, Sendai; Yoshio Ishihara, Tokyo, all of (JP)

(73) Assignee: Nippon Sanso Corporation, Tokyo (JP)

(*) Notice: Subject to any disclaimer, the term of this patent is extended or adjusted under 35 U.S.C. 154(b) by 0 days.

(21) Appl. No.: 09/101,879

(22) PCT Filed: Nov. 21, 1997

(86) PCT No.: PCT/JP97/04242

§ 371 Date: Jul. 14, 1998

§ 102(e) Date: Jul. 14, 1998

(87) PCT Pub. No.: WO98/24123

PCT Pub. Date: Jun. 4, 1998

(30) Foreign Application Priority Data

Nov. 26, 1996 (JP) .............................. 8-315193

(51) Int. Cl.⁷ .............................................. G06F 19/00
(52) U.S. Cl. ........................................ 700/121; 700/264
(58) Field of Search ................................ 700/121, 117, 700/184, 264; 414/217, 744.5, 939; 250/441.11; 901/3, 4

(56) References Cited

U.S. PATENT DOCUMENTS

| 5,049,029 A | * | 9/1991 | Mitsui et al. ............. 414/744.5 |
| 5,151,008 A | * | 9/1992 | Ishida et al. ............. 414/744.5 |
| 5,518,360 A | * | 5/1996 | Toda et al. .................. 414/755 |
| 5,611,655 A | * | 3/1997 | Fukasawa et al. .......... 414/217 |
| 5,934,856 A | * | 8/1999 | Asakawa et al. ............ 414/217 |
| 5,953,591 A | * | 9/1999 | Ishihara et al. ............. 438/115 |
| 5,985,811 A | * | 11/1999 | Masayuki et al. .......... 510/175 |

FOREIGN PATENT DOCUMENTS

| JP | 5-3240 | 1/1993 |
| JP | 5-275519 | 10/1993 |

* cited by examiner

Primary Examiner—William Grant
Assistant Examiner—Kidest Bahta
(74) Attorney, Agent, or Firm—Darby & Darby

(57) ABSTRACT

The present invention uses a transportation robot furnished with a storage chamber 3 that can store substrate wafers S under an inert gas atmosphere, and when transporting substrate wafers S between transportation chambers 2 installed on processing apparatus 1 and holding an inert gas atmosphere, connection chamber 4 is disposed between storage chamber 3 and transportation chamber 2 when placing and removing substrate wafers S between storage chamber 3 of transportation robot 30 and the transportation chamber 2 of processing apparatus 1, and after introducing inert gas into the connection chamber 4 at low pressure, opening the gate valves GV1 and GV2 between storage chamber 3 and transportation chamber 2.

6 Claims, 4 Drawing Sheets

TRANSPORTATION METHOD FOR SUBSTRATE WAFERS AND TRANSPORTATION APPARATUS

FIELD OF THE INVENTION

The present invention relates to a transportation method and transportation apparatus using a transport robot for transporting between processing steps substrate wafers used, for example, in semiconductor integrated circuits, liquid crystal displays panels, solar battery panels.

This application is based on patent application No. Hei 8-315193 filed in Japan, the content of which is incorporated herein by reference.

DESCRIPTION OF RELATED ART

Semiconductor elements such as semiconductor integrated circuits and semiconductor lasers, active matrix type liquid crystal display panels, solar battery panels, etc., are manufactured by a process of laminating in sequence various predetermined thin films on a silicon substrate, gallium arsenide substrate, glass substrate, etc. whose surfaces are highly cleaned. An extremely high degree of precision is required in the manufacture of each of these products, and if only a slight amount of impurity adheres to or is absorbed by the surface of the processed substrates, that is, the substrate wafer, it is difficult to manufacture a high quality product. In addition, during transportation or in the course of each type of processing, these substrate wafers can acquire static electricity, and as a result, it is easy for impurities to be attracted to or adhere to them.

For example, if water, an impurity such as moisture, is absorbed by the surface of a semiconductor substrate during a manufacturing step, it will cause a hindrance to the manufacturing step. Furthermore, if the amount of water is large, a natural oxide film will generate on the film surface if there is oxygen in the atmosphere. In addition, in the manufacturing steps of the thin film transistor (TFT) used in liquid crystal panels, if there is water on the surface of the insulating film made, for example, of $SiN_x$, it is impossible to precisely form an amolphous silicon (a-Si) film with uniform thickness on top of it. Additionally, the process of fabricating gate oxide film in the manufacturing integrated circuits (IC), if there is water on an n- or p-region surface, an $SiO_x$ film will form at the interface between the $SiO_2$ and Si, and the MOS transistor will not function as a switch. Similarly, if there is water on the surface of a capacitor, an $SiO_x$ film will form in its interface making it impossible to charge the capacitor electrode, and it will not function as a memory device.

In addition, in order to prevent spiking due to tungsten silicide in the wiring process, a TiN film is formed before depositing a tungsten (W) film, but if there is water on the substrate, problems such as the deterioration of the adhesiveness of the TiN film occur.

Furthermore, when there are impurities other then water, for example, organic impurities such as methane, during heat processing, the silicon reacts with the carbon on the surface of the substrate (silicon), forming an SiC film, and problems are caused in the operating characteristics of the device.

Usually, each type of processing apparatus used in the manufacture of semiconductor integrated circuits, etc., are disposed in a clean room from which particulate matter has been filtered. Because semiconductor integrated circuits, etc, are manufactured by many processing steps, in order to carry out the operation of each step, the work (the substrate wafer) is transported from one processing apparatus to the processing apparatus of the next step. In order to do this, the substrate wafer is exposed to the air in the clean room at the time of transportation.

The interior of a clean room is usually maintained at a temperature of 20~25° C. and at a relative humidity of about 50%, and the gaseous impurities of the excluded particles may exist in abundance. Because of this, the impurities that exist in the atmosphere of the clean room are absorbed by the surface of the substrate wafer. For example, water can be instantaneously absorbed by the surface of the substrate wafer. When trying to prevent the absorption of this water, it is in fact, however, extremely difficult to exclude water from the entire clean room.

Thus, a transportation system in which substrate wafers are transferred from one processing apparatus to the next processing apparatus in an inert gas atmosphere using a special transport robot transporting substrate wafers is proposed.

The transportation robot in this case is provided with a storage box (storage chamber) which can store substrate wafers in an inert gas atmosphere. In addition, on the processing apparatuses which carry out operations of each step, a transportation chamber to which substrate wafers can be delivered in the inert gas atmosphere is provided as an accessory.

In this transportation system, by activating a transportation robot, the substrate wafers stored in the inert gas atmosphere in the storage box are transported from the transportation chamber of one step to the transportation chamber of the next step. Additionally, at the stage where the transportation robot has arrived in front of the transportation chamber, the storage box of the transportation robot and the transportation chamber are connected, and there respective gates are opened, and between the storage box and the transportation chamber, the delivery of the substrate wafer occurs. For example, the substrate wafers are brought into the transportation chamber from the storage box, these substrate wafers are transferred from the transportation chamber to the processing apparatus, and a predetermined processing is carried out. When the processing is finished, the substrate wafers are returned to the transportation chamber, and again returned to the storage box. Finally, the gates are closed, and the substrate wafers are transported to the next step by activating the transportation robot.

However, delivering the substrate wafers between the storage box of the transportation robot and the transportation chamber of the processing apparatus is carried out via a gate valve installed in each gate of the storage box and the transportation chamber, and the front surface of the gate valve having a concave part is structurally unavoidable. Because of this, the air in the clear room collects in this concavity, and as a result, the problem arises that when placing or removing the substrate wafers, simultaneously the air collected in this concavity becomes mixed into the transportation chamber and the storage box. Therefore, even if the interior of the storage box, transportation chamber, or processing apparatuses are maintained with an highly cleaned atmosphere having almost no particles, water, gaseous impurities, etc., when placing and removing the substrate wafers, mixing with a small amount of air cannot be avoided, and causing a deterioration in each processes carried out on the substrate wafers.

In addition, when the substrate wafers are stored in the storage box and transported to the next process, in order to preserve the highly cleaned atmosphere of the storage box, a container (cylinder) filled with highly pure inert gas is maintained in the transportation robot. In addition, because impurities in the storage box are not monitored, a gas flow always larger than the necessary amount is ventilated from this container. As a result, the problem arises that the container is enlarged, and the transportation robot itself must become large. In order to miniaturize the container, when the amount of the gas flow was decreased, the problem arises that it becomes very difficult to maintain the highly pure atmosphere.

SUMMARY OF THE INVENTION

The object of the present invention is to provide a transportation method and a transportation means which can prevent mixing of air which accumulates in the concavity in the front surface of the gate valve when the substrate wafer is transported from one process to the next process by a transportation robot provided with a storage box.

The transportation method for substrate wafers of the present invention is characterized as a method in which substrate wafers are transported between transportation chambers attached to processing apparatus and containing an inert gas atmosphere using a transportation robot provided with a storage chamber which can store a substrate wafer in an atmosphere of inert gas, and during placement and removal of the substrate wafer between the storage chamber of said transportation robot and the transportation chamber of the processing apparatus, disposing a connection chamber between the storage chamber and the transportation chamber, and after introducing the inert gas into said connection chamber at low pressure, opening the gate of the storage chamber and the transportation chamber, and placing or removing the substrate wafer.

In this transportation method of substrate wafers, the above inert gas is measured at a semiconductor laser detector, and from the result the ratio of impurities in the chambers is calculated, and it is preferable that the amount of inert gas introduced in each chamber and the placement and removal operation for the substrate wafer be controlled based on this data.

Furthermore, in the transportation method for substrate wafers of the present invention, the preferred structure is that wherein if the volume of said storage chamber, transportation chamber, and connecting chamber are respectively $V_1$ [cm$^3$], $V_2$ [cm$^3$], and $V_3$ [cm$^3$], respectively, and the impurity ratios are $\gamma_1$, $\gamma_2$, and $\gamma_3$, respectively, when the total area of said substrate wafer is S [cm$^2$], then when: $2.7 \times 10^{19}$ [molecules/cm$^3$]$\times(V_1 \times \gamma_1 + V_2 \times \gamma_2 + V_3 \times \gamma_3) \leq 10^{13}$ [molecules/cm$^2$]$\times S$ is satisfied, said substrate wafer is placed in or removed from between said storage chamber and said transportation chamber.

In the transportation method of substrate wafers of the present invention, in place of the above-mentioned inert gas, it is possible to use a mixed gas comprising an inert gas and oxygen gas.

In addition, the transportation apparatus for substrate wafers of the present invention is characterized in having a sealed transportation chamber attached to a processing apparatus for a substrate wafer, providing a placement and removal opening for placing and removing the substrate wafer between the outside of said transportation chamber, providing a gate valve on this placement and removal opening which seals this placement and removal opening, and on a transportation robot which can move between transportation chambers providing a sealed storage chamber which stores the substrate wafer, providing a placement and removal opening for placing and removing substrate wafers between the outer part of the storage chamber, providing a gate valve on this placement and removal opening which seals this placement and removal opening, and by opening the gate valve when the storage chamber and transportation chamber are connected, in the transportation apparatus of the substrate wafer which places and removed the substrate wafer, providing a sealed connection chamber interposed between this storage chamber and transportation chamber, and providing a gas intake opening and an exhaust opening for ventilating inert gas to the storage chamber, transportation chamber, and connection chamber, a vacuum exhaust means for ventilating at low pressure.

In this transportation apparatus, it is preferable that the structure be provided with a semiconductor laser detector which measures the concentration of impurities in each chamber, and a control means which calculates the ratio of impurities in each chamber from the concentration of impurities, and controls the placing and removing of substrate wafers between the storage chamber and the transportation chamber based on this calculation.

In the transportation apparatus for substrate wafers, in place of the above-mentioned inert gas, a mixture of inert gas and oxygen gas can also be used.

PREFERRED EMBODIMENTS OF THE INVENTION

Below, the embodiments of the invention will be explained with reference to the figures.

Figure 1:
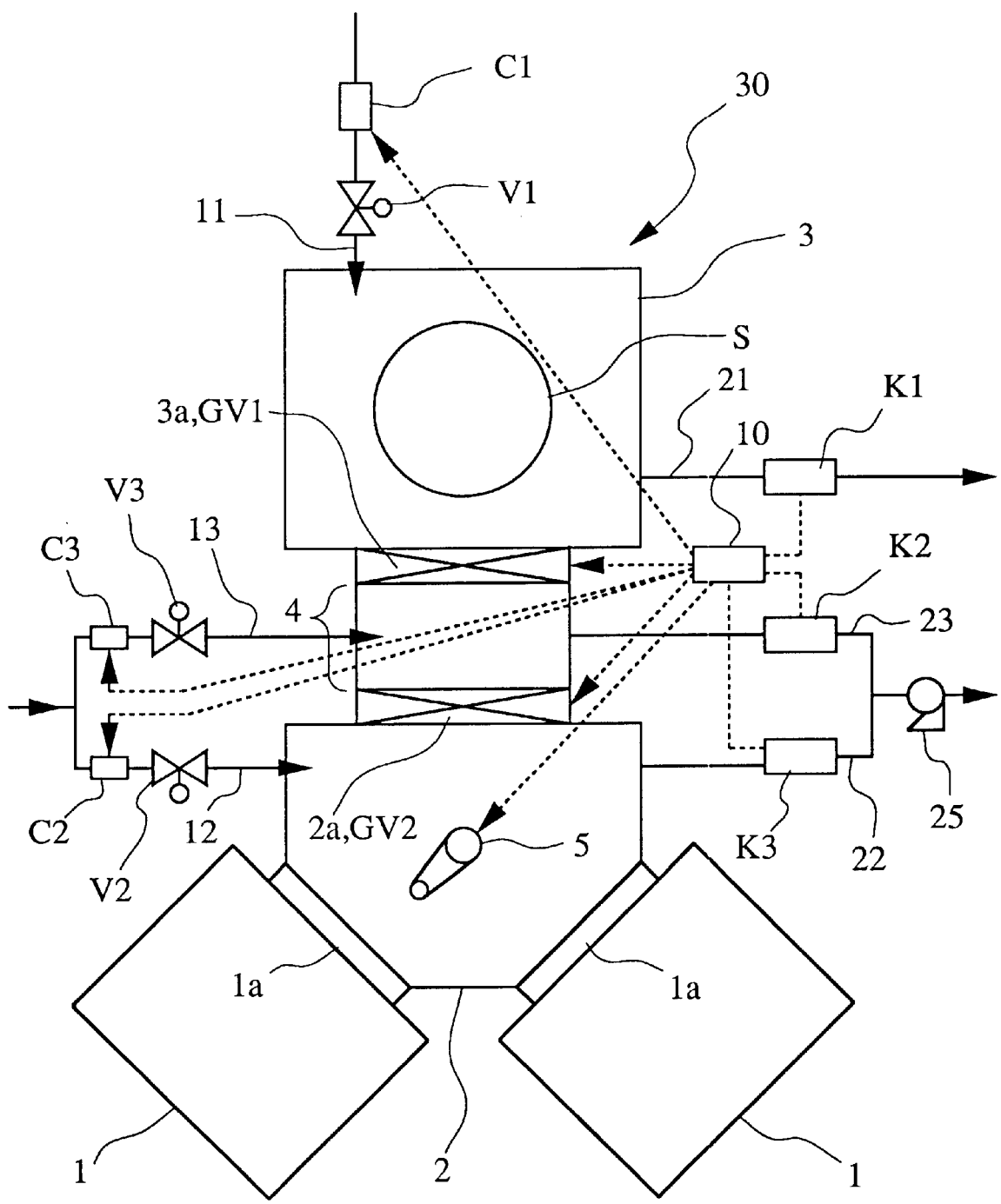
FIG. 1 is a schematic plan of an embodiment of the present invention.
Figure 2:
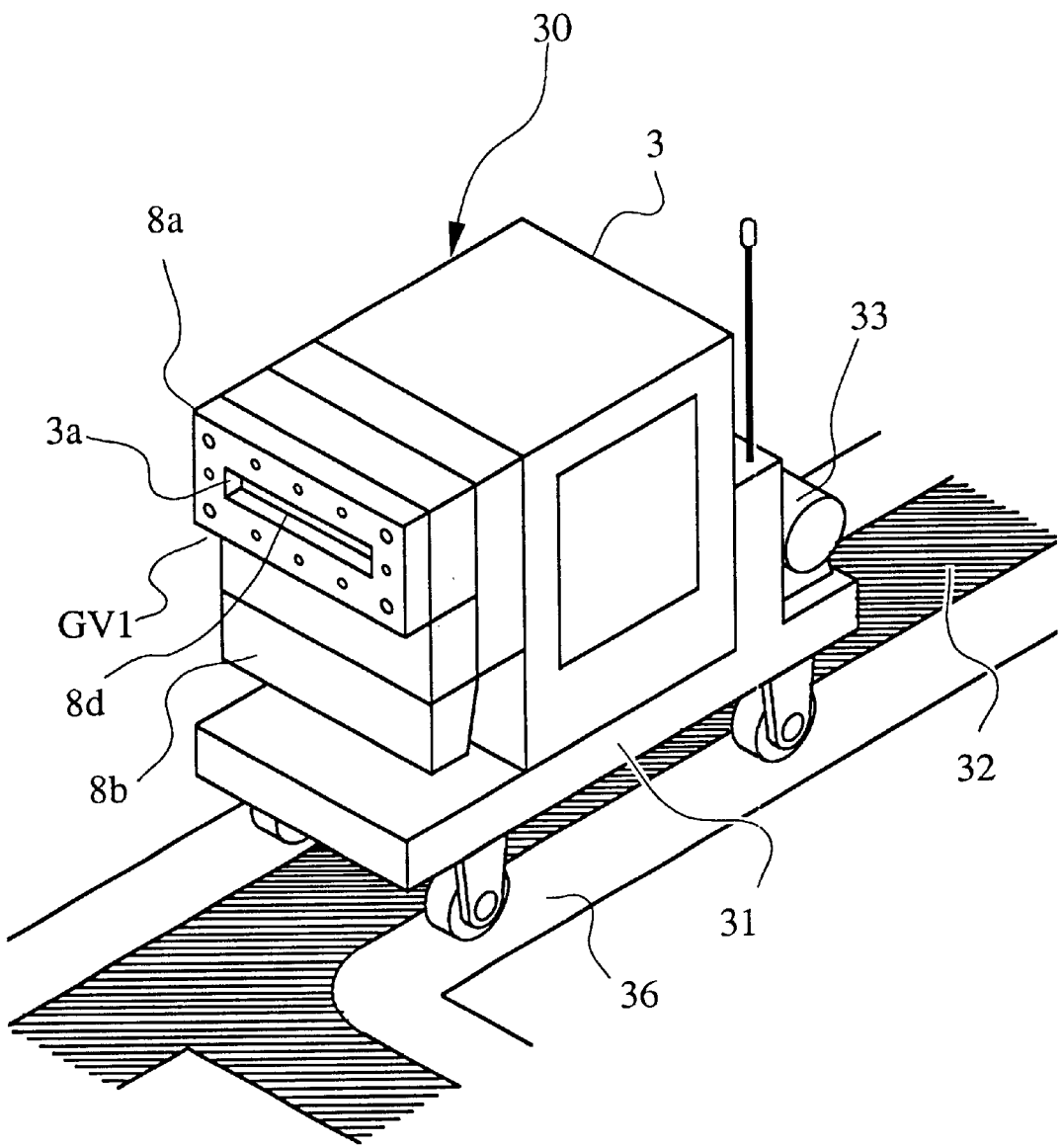
FIG. 2 is an external diagonal view of the transportation robot in an embodiment of the present invention.

First, a summary of the transportation apparatus of the present invention will be explained. This transportation apparatus transports thin film substrates which are undergoing several steps in the fabrication process using a transportation robot. FIG. 1 is a schematic diagram showing the transportation robot 30 connected to the transportation chamber 2 installed on processing apparatus 1. FIG. 2 is a diagonal view of the transportation robot.

In this transportation apparatus, a sealed transportation chamber 2 is installed on the processing apparatus 1 for the substrate wafer S. In this example, in transportation chamber 2, two processing apparatus 1 are connected respectively by a gate valve. The processing apparatus 1 carry out predetermined process on the substrate wafers S, and correspond to many substrate processing apparatuses used, for example, in the film formation processing, such as a CVD device and a vacuum evaporator, a diffusion furnace in doping, or a plasma-etching apparatus used in etching. In transportation chamber 2, a transfer hand 5 is installed, and this transfer hand 5 places and removes a substrate wafer S between storage box 3 and transportation chamber 2, and transportation chamber 2 and the processing apparatus 1.

Figure 4:
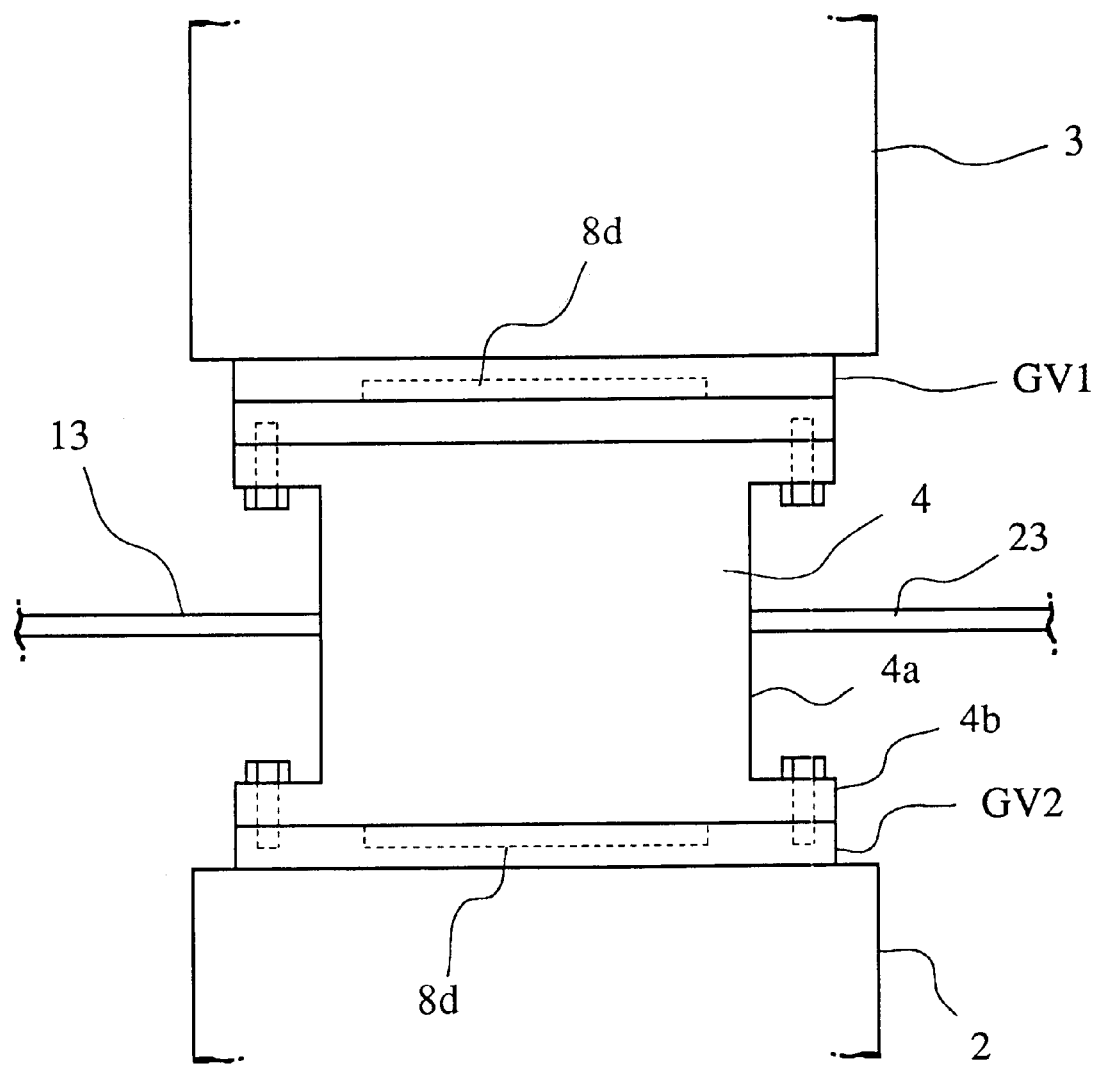
FIG. 4 is an enlargement of the essential elements of FIG. 1.

On transportation chamber 2, a placing and removal opening 2a for placing and removing the substrate wafer S to the outside, and on this placing and removal opening 2a, a gate valve GV2 which can provide a sealed cover for the placing and removal opening 2a. Additionally, joined to the outer surface of this gate valve GV2 is a connection tube 4a which forms a connection chamber 4 by the interior space. The connection tube 4a, as shown in FIG. 4, is installed on the transportation chamber 2 by one end of a flange 4b, and on the other end of the flange 4b, the forward end surface of the gate valve GV1 (described below) of the transportation robot 30 is connected in an airtight manner.

The transportation robot 30 can freely move between a plurality of transportation chambers 2, and is provided with a movable substrate wafer storage box (storage chamber) 3. This transportation robot 30, as shown in FIG. 2, is guided along a magnetic rail 31 on the floor upon which is spread a dustless sheet 36, and moves itself by actuating a motor 33. The storage box 3 can be maintained in an airtight condition, and on its front, a placing and removal opening 3a for placing and removing a substrate wafer S between the interior and exterior of the storage chamber 3 is installed, and on this placing and removal opening 3a, an airtight gate valve GV1 is installed.

Figure 3A:
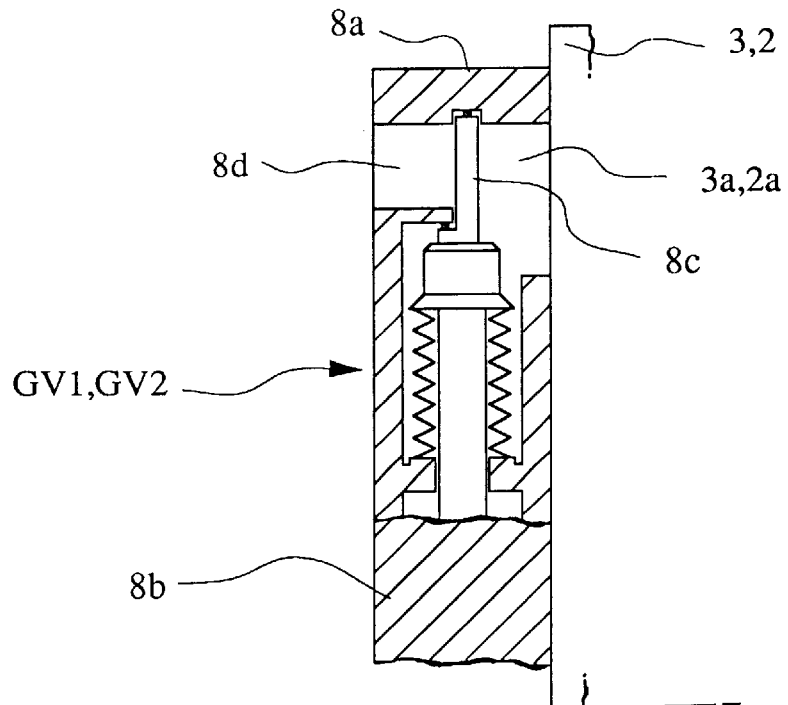
FIG. 3 is a cross-section of the necessary elements of the gate valve in an embodiment of the present invention; (a) shows a closed state, and (b) shown an open state.

The gate valves GV1 and GV2 are shown in FIGS. 3(a) and (b) in a closed and open condition, respectively, and on a casing 8a of appropriate plate thickness, which secures the placing and removal openings 2a and 3a, a freely sliding gate plate 8c is installed, and by activating the gate plate 8c by the actuating mechanism 8b, the above-described placing and removal openings 2a and 3a can be opened and closed. When gate plate 8c is in a closed condition, as shown in FIG. 3(a), a concavity 8d is formed on the front surface of gate plate 8c.

In addition, as shown in FIG. 1, on the storage box 3 of the above-described transportation robot 30, a gas intake opening 11 and exhaust opening 21 are installed to purge the interior of the storage box 3 with inert gas. On the gas intake opening 11, a valve V1 is installed, and by opening this valve V1 when the gas intake opening 11 connected with the gas supply source, inert gas is introduced into the storage box 3.

Furthermore, in order to provide an highly cleaned atmosphere in both the transportation chamber 2 and the connection chamber 4, the gas intake openings 12 and 13 and exhaust openings 22 and 23 are installed to ventilate the inert gas. On each of the gas intake openings 12 and 13, valves V2 and V3 are installed, and by opening valves V2 and V3 when the gas intake openings 12 and 13 are connected to the gas supply source, inert gas can be introduced into the transportation chamber 2 and connection chamber 4. Moreover, above the valves V1, V2, and V3 of these gas intake openings, flow amount control mechanisms C1, C2, and C3 are installed.

Each exhaust opening 21, 22, and 23 is connected to a vacuum exhaust means (one part illustrated as a vacuum pump 25), and the exhaust line of each chamber is provided with an impurity measuring means for measuring impurities, here, for example, semiconductor laser detectors K1, K2, and K3. In addition, a control means 10 is provided which executes the operational control of each valve GV1 and GV2, the flow control devices C1, C2, and C3 of each gas intake opening, and the transfer hand 5 according to the results of the measurement of the semiconductor laser detectors K1, K2, and K3. In the exhaust line, in addition to online measurement provided with a semiconductor laser detector (an impurity detection means), each chamber is provided with a window, and via this window when a laser oscillator and an optical receiver which receives laser light from an oscillator are provided, in situ measurement can be carried out.

Here, the introduced inert gas is a gas which does not react with the substrate wafer S and from which all particles and water have been removed. As the inert gas, it is possible to use, for example, nitrogen gas, argon gas, and helium gas. In addition, when unavoidable damage occurs to the transportation robot and the processing apparatuses, etc., if large amounts of inert gas are released into the clean room, as a safety measure, it is possible in advance to use an inert gas with oxygen added in the purge gas. Here, the added oxygen gas used has particles, water, and gaseous impurities removed. Moreover, there are the dangers that if the concentration of oxygen in the above mixed gas is less than 18%, large amounts of gas with low oxygen concentration will flow in to the clean room, and if gas with a concentration of oxygen equal to or greater than 22% flows into the clean room, a small amount of static electricity might cause a fire. Thus, it is preferable that the concentration of oxygen in the mixed gas be between 18% by volume and 22% by volume.

The semiconductor laser detectors K1, K2, and K3 are constructed from at least an oscillator which oscillates laser light having an oscillating wavelength in the infrared region, and an optical receiver which measures the absorption spectrum of the received laser light.

If the oscillator or the optical receiver oscillates the below-described wavelengths of the laser light, or receive light, as an oscillator, a tunable InGaAsP distributed feedback (DFB) semiconductor laser is preferable, but other types are possible. Because a DFB semiconductor laser has a diffraction lattice in the electron injection region and single mode oscillation, a spectroscope, such as a monochromator, is unnecessary, and there is little loss of light, and the apparatus can be made compact.

Similarly, Distributed Bragg Reflection (DBR) which has single mode oscillation and a diffraction lattice outside the electron injection region is preferable.

As an optical receiver, a solid-state photo-detector, which is an photo-detector having a sensitivity to the wavelengths of laser light of the oscillator used, is formed, for example, from Ge and InGaAs is preferable. When measured by this kind of semiconductor laser detector, a window through which semiconductor laser light passes is installed on exhaust lines from the storage box, the connect ion chamber, or the transportation chamber, or on each chamber, and by providing an oscillator and optical receiver on this window, it is possible to measure impurities in the atmosphere within each chamber, and possible to detect very small amounts of impurities. In addition, it is easy to adjust the oscillation wavelength. Further, because it is possible to detect the concentration of impurities instantaneously, it is preferable the impurity data be utilized as feedback.

If $H_2O$ is being detected as the impurity, the oscillating wavelength should be between 1.35~1.42 $\mu$m. Similarly, the following oscillation frequencies can be used:

$CO_2$: 1.43~1.46 $\mu$m, $CH_4$: 1.29~1.50 $\mu$m, $SiH_4$: 1.19~2.0 $\mu$m,

HF: 1.25~1.35 $\mu$m,

HBr: 1.34~1.37 $\mu$m, $O_2$: 0.75~0.78 $\mu$m.

Furthermore, if the oscillating wavelength from the oscillator sweeps the 0.75~2 $\mu$m range, it is possible to measure simultaneously $H_2$, $CO_2$, $CH_4$, $SiH_4$, HF, HBr, and $O_2$, which are gas contaminants.

The determination of impurities using semiconductor lasers can apply various well known means, and can apply methods such as that disclosed in Japanese Patent Application, First Publication, No. Hei 5099845. In brief, from a measured absorption spectrum, the absorption spectrum of the inert gas in the storage box 3, the connection chamber 4, and the transportation chamber 2 are balanced, the absorption peak for the impurities is determined and identified, the absorption peak which so far as possible has no interference peak in its vicinity is chosen, and from this absorption intensity the quantities of impurities are determined. In addition, sweeping the wavelengths can easily be carried out by changing electric current to the oscillator or temperature of the oscillator.

In the above-described manner, when the pressure in each chamber is less than or equal to atmospheric pressure, in particular an impurity measurement means using an effective semiconductor laser detector has been explained, but then the pressure in each chamber exceeds atmospheric pressure, it is possible to easily and inexpensively measure the impurities such as water in the gas if a gas chromatograph is installed and connected to each gas exhaust opening.

Next, the transportation method of the present invention will be explained along with the operation of this transportation apparatus.

When a transportation robot 30 has conveyed substrate wafers S in a storage box 3 to a certain process, the storage box 3 is connected to transportation chamber 2 via the connection chamber 4. Then according to a command from the control means 10, the pressure in the connection chamber 4 is lowered, and the inert gas is introduced, and at the same time, the concentrations of impurities in the storage box 3, the connection chamber 4, and the transportation chamber 2 are measured by semiconductor detectors K1, K2, and K3. Next, in the control means 10, the ratio of impurities in each chamber is calculated from this impurity concentration, and based on this data, the amount of the flow of the introduced purging gas (the inert gas) is controlled. In addition, along with this, when the ratio of impurities reaches a predetermined value, gate valves GV1 and GV2 are opened, and placing and removal of the substrate wafers S takes place between the storage box 3 and the transportation box 2 via the connection chamber 4.

When the ratio of impurities in the storage box 3 becomes high, while being moved to the next process by the transportation robot 30, the amount of impurities on the surface of the substrate wafer S in the storage box 3 will increase. In addition, when the ratio of impurities in the transportation chamber 2 becomes high, a large amount of impurities on the surface of the processed substrate wafer S will be absorbed, inviting the danger of lowering the yield and having a bad influence on the next process. Due to this, the amount of the flow of the purge gas is controlled so that the ratio of impurities in the storage box 3 and the transportation chamber 2 are equal to or less than a stipulated value.

Figure 3B:
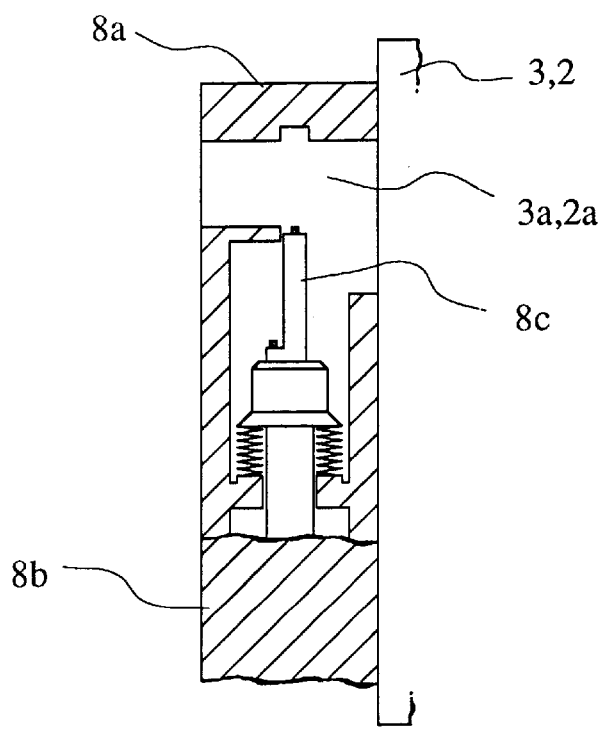

In the above manner, by connecting the storage box 3 and the transportation chamber 2 via connection chamber 4, and with the connection chamber 4 in a gas purged state, the substrate wafer S being placed and removed, the air in the clean room accumulating in the concavity 8d (see FIG. 3) of the gate valves GV1 and GV2 of the storage box 3 and the transportation chamber 2 does not mix in the transportation chamber 2 then placing and removing the substrate wafer S. Therefore, it is possible to avoid the deleterious influence of impurities introduced when placing the substrate wafer S.

In particular, because the amount of the flow of the purge gas in each chamber 2, 3, and 4 is controlled by the impurity data obtained by the semiconductor laser detectors K1, K2, and K3, and at the stage when the ratio of impurities is within a stipulated value, gate valves GV1 and GV2 are opened, and at the same time the placing and removal of the substrate wafer S is carried out by the transfer hands 5 and 6, the substrate wafer S can always be placed and removed in an highly cleaned atmosphere.

Additionally, because the amount of flow of the purge gas in each chamber 2, 3, and 4 is controlled by the impurity data, it is possible to introduce only the necessary amount of gas into each chamber, and in particular, it is possible to make compact the container which is full of the purge gas (the inert gas or the mixture of inert gas and oxygen) held in the transportation robot.

Concretely, when the impurity is water or organic carbon, the placing and removal is carried out in the following stage.

If the volume of the storage box 3 is $V_1$ [cm$^3$], the volume of the transportation chamber 2 $V_2$ [cm$^3$], the volume of the connection chamber 4 $V_3$ [cm$^3$], the ratio of impurities in the storage box 3 is $\gamma_1$, the ratio of impurities in transportation chamber 2 $\gamma_2$, the ratio of impurities in connection chamber 4 $\gamma_3$, and the entire surface area of the substrate wafer S in the storage box 3 or the transportation chamber 2 is S [cm$^3$], then when:

$$2.7 \times 10^{19} [\text{molecules/cm}^3] \times (V_1 \times \gamma_1 + V_2 \times \gamma_2 + V_3 \times \gamma_3) \leq 10^{13} [\text{molecules/cm}^2] \times S \quad \text{(Eq. A)}$$

is satisfied, gate valve GV1 is open, and the substrate wafer S it moved from the storage box 3 to the transportation chamber 2.

In this manner, if the amount of absorbed impurities involved in transportation is equal to or less than $10^{13} \times S$, or preferably $10^{10} \times S$, it is possible to limit the absorbed impurities on the surface of the substrate wafer to a mono-layer. If limited to a mono-layer, in the case that the impurity is water, because there are only gas molecules around the water molecules, even if there exists oxygen, a native oxide film will not generate. In addition, in the case of organic contaminants (organic carbons) as well, if there is absorption in a mono-layer it is possible to eliminate it at low energy.

Furthermore, substrate wafer S, which is moved to transportation chamber 2 when the above Eq. A is satisfied, is placed in a predetermined processing apparatus 1 by the transfer hand 5, and undergoes a predetermined process by processing apparatus 1. After the predetermined process ends, the substrate wafer S is transferred from the transportation chamber 2 to storage box 3 by the transfer hand 5, and by actuating the transportation robot 30, it is transported to the next step.

EMBODIMENT

Transportation of the substrate wafer S was carried out using the transportation apparatus of the present Invention, and the presence of native oxide film and the amount of organic contaminants was measured.

These measurements were carried out under the following conditions:

| (1) Volume | storage box | 2.53 × 10$^4$ cm$^3$ |
|---|---|---|
| | transportation chamber | 6.12 × 10$^4$ cm$^3$ |
| | connection chamber | 0.70 × 10$^4$ cm$^3$ |

(2) Resistance value of the substrate wafer:

2~4 Ω·cm, n-type (100) silicon substrate surface area: 1.41×10$^3$ cm$^2$/sheet× 25 sheets= 3.53×10$^4$ cm$^2$.

The following results of the ratio of impurities were obtained from the results of measurement by semiconductor laser detectors K1, K2, and K3:

(3) Ratio of impurities

| contaminants | water | organic |
|---|---|---|
| storage box | $1.4 \times 10^{-7}$ | $1.2 \times 10^{-7}$ |
| transportation chamber | $1.3 \times 10^{-7}$ | $1.2 \times 10^{-7}$ |
| connection chamber | $1.3 \times 10^{-7}$ | $1.2 \times 10^{-7}$ |

Under these conditions, carrying out experimental transportation of a substrate wafer S from storage box 3 to transportation box 2, neither a native oxide film nor absorption of organic contaminants on the surface of the substrate wafer S returned to the storage box 3 was detected by X-ray photoelectron spectroscopy or FT-IR (Fourier transform infrared spectroscopy).

POTENTIAL INDUSTRIAL USE

In the above explanation, according to the present invention, because the storage box of a transportation robot and the transportation chambers of processing apparatuses were connected via a connecting chamber, the connection chamber was gas purged, and a substrate wafer was placed and removed, air in the clean room which accumulated in the concavity of the gate valve in the storage box and the transportation chamber was not introduced into the transportation chamber when the substrate wafer was placed and removed. Therefore, it is possible to prevent deleterious influence of impurities mixing when the substrate wafer is placed.

In addition, because the amount of purge gas in the storage chamber, transportation chamber, and connection chamber, was controlled by the impurity data, it is possible to introduce only the necessary amount of gas into each chamber, and in particular it is possible to make compact the container which is full of purge gas held in the transportation robot.

What is claimed is:

1. A transportation method for substrate wafers wherein substrate wafers are transported between transportation chamber s attached to processing apparatuses and holding an inert gas atmosphere using a transportation robot provided with a storage chamber which can store substrate wafers under an inert gas atmosphere, comprising the steps of:

disposing a connection chamber between the storage chamber and the transportation chamber, wherein the volume of the storage chamber, the transportation chamber, and the connection chamber are respectively $V_1$ [cm$^3$], $V_2$ [cm$^3$], and $V_3$ [cm$^3$], the ratio of impurities in each chamber are respectively $\gamma_1$, $\gamma_2$, and $\gamma_3$, and the entire surface area of the substrate wafers is S [cm$^3$];

opening the gate of the storage chamber and transportation chamber after introducing an inert gas into said connection chamber under a condition of lower pressure, and placing and removing substrate wafers between the storage chamber of said transportation robot and the transportation chamber of the processing apparatus when the condition $$2.7 \times 10^{19} \text{[molecules/cm}^3\text{]} \times (V_1 \times \gamma_1 + V_2 \times \gamma_2 + V_3 \times \gamma_3) \leq 10^{13} \text{[molecules/cm}^2\text{]} \times S$$

is satisfied.

2. A transportation method for substrate wafers according to claim 1 further comprising the steps of:

measuring said inert gas with a semiconductor laser detector, calculating the ratio of impurities in each of said chambers from the results, and controlling the amount of the inert gas introduced and the placement and removal operation of the substrate wafer to each chamber based on this data.

3. A transportation method for substrate wafers according to claim 1 wherein a mixture of inert gas and oxygen is used in place of said inert gas.

4. A transportation apparatus for substrate wafers comprising:

a sealed transportation chamber installed on a processing apparatus of the substrate wafers, said transportation chamber having a placement and removal opening by which substrate wafers are placed in and removed from the transportation chambers, a gate valve at said placement and removal opening to seal the placement and removal opening, a transportation robot having a sealed storage chamber for storing substrate wafers transported from said transportation chamber, said storage chamber having a placement and removal opening and a valve gate at said storage chamber placement and removal opening which seals said placement and removal opening, a sealed connection chamber for communication between said storage chamber and said transportation chamber, and a gas intake opening and exhaust opening for ventilating the inert gas in each of said storage chamber, transportation chamber, and connection chamber, vacuum exhaust means for carrying out purging at low pressure, wherein the volume of the storage chamber, the transportation chamber, and the connection chamber are respectively $V_1$ [cm$^3$], $V_2$ [cm$^3$], and $V_3$ [cm$^3$], the ratio of impurities in each chamber are respectively $\gamma_1$, $\gamma_2$, and $\gamma_3$, and the entire surface area of the substrate wafers is S [cm$^3$], and wherein when the condition of:

$$2.7 \times 10^{19} \text{[molecules/cm}^3\text{]} \times (V_1 \times \gamma_1 + V_2 \times \gamma_2 + V_3 \times \gamma_3) \leq 10^{13} \text{[molecules/cm}^2\text{]} \times S$$

is satisfied, said transportation chamber operates to move the substrate wafers from the storage chamber to the transportation chamber.

5. A transportation apparatus for substrate wafers according to claim 4 further comprising:

a semiconductor laser detector which measures the concentration of impurities in each chamber, and a control means which calculates the ratio of impurities in each chamber from the concentration of said impurities, and controls the placing and removing of the substrate wafer between the storage chamber and the transportation chamber based on these calculation results.

6. A transportation apparatus for substrate wafer according to claim 4 wherein a gas mixture of inert gas and oxygen is used in place of inert gas.

* * * * *